United States Patent [19]

Balzarini et al.

[11] 4,258,426
[45] Mar. 24, 1981

[54] DEVICE FOR SELECTING VALUES OF DATA ELEMENTS

[75] Inventors: Giovanni Balzarini, Lesto Calende; Roberto Papeschi, Milan, both of Italy

[73] Assignee: U.S. Philips Corporation, New York, N.Y.

[21] Appl. No.: 5,938

[22] Filed: Jan. 24, 1979

[30] Foreign Application Priority Data

Jan. 27, 1978 [IT] Italy .................. 19708 A/78

[51] Int. Cl.³ ............................................. G06F 3/14
[52] U.S. Cl. .................................. 364/518; 340/365 R; 340/802
[58] Field of Search ............................... 364/518, 709; 340/365 R, 365 S, 365 C, 365 L, 365 P, 365 A, 365 E, 802, 709, 712; 58/39.5, 85.5

[56] References Cited

U.S. PATENT DOCUMENTS

| | | | |
|---|---|---|---|
| 3,781,874 | 12/1973 | Jennings | 340/365 S |
| 4,010,603 | 3/1977 | Forsyth | 58/39.5 |
| 4,033,108 | 7/1977 | Bennett et al. | 58/85.5 |
| 4,058,971 | 11/1977 | Epperson | 58/39.5 |
| 4,059,955 | 11/1977 | Prak | 58/85.5 |
| 4,104,864 | 8/1978 | Ishikawa et al. | 58/39.5 |
| 4,112,429 | 9/1978 | Tsuha et al. | 340/365 C |
| 4,125,993 | 11/1978 | Emile, Jr. | 340/802 |
| 4,125,995 | 11/1978 | Kashio | 58/85.5 |
| 4,142,361 | 3/1979 | Kimura | 58/39.5 |
| 4,158,759 | 6/1979 | Mason | 340/365 R |

FOREIGN PATENT DOCUMENTS 1287053 8/1972 United Kingdom .
1417850 12/1975 United Kingdom .

Primary Examiner—Charles E. Atkinson
Assistant Examiner—Gary Chin
Attorney, Agent, or Firm—Thomas A. Briody; Robert T. Mayer; James J. Cannon, Jr.

[57] ABSTRACT

Device for selecting values of data elements forming part of a group of data elements includes an operation circuit, a display unit and first register for registering and delivering values of data elements to the display unit. The operating circuit, depending upon the time such circuit is activated, causes the selection of a value of a data element. A second register is provided for registering and delivering to the first register and to the display unit indication information controlling which one of the data elements out of the group of data elements is to be selected. A third register is also included to alter the indication information on a repeated activation of the operation circuit so that subsequent data elements out of the group of data elements are prepared for value selection. Other embodiments of the device includes a plurality of separate operation circuits, of separate operation circuits, an erase feature and implementation with a programmable digital signal processor.

4 Claims, 17 Drawing Figures

DEVICE FOR SELECTING VALUES OF DATA ELEMENTS

BACKGROUND OF THE INVENTION

1. Field of the Invention

The invention relates to a device for selecting values of data elements forming part of a group of various types of data elements, the device comprising an operation means, display means and first register means for registering and delivering values of data elements to said display means; the operation means, dependent upon the time said means is operated, causing the selection of a value of a data element. Said group of data elements may comprise data elements such as digit elements for the ones, for the tens, for the hundreds etc, with which decimal values of parameters can be denoted and selected. Furthermore also other data elements are possible such as a function notation, in which case out of a number of different functions one function (i.e. the "value" of the function data element) can be selected, or a command, the values of which can for example be "go" or "no go" respectively.

2. Description of the Prior Art

Such devices in which the operation means is commonly formed by a key or switch, are known in the art. For example in channel selection devices for television apparatus it is known to have only one key by which, dependent upon the time said key is pressed, a certain channel number representing the value of this data element "channel" is selectable. Also in other types of apparatus, this type of input selection device is known, for example for ovens used as household appliances. In such appliances, for example, a temperature has to be selected from a complete temperature range. In the known device this is realized by an up/down key device, having an up-key and a down-key by which the values of the subsequent temperatures pass over a display means. Hereby there is no distinction between data elements "ones" and "tens" and "hundreds", rather the temperatures are presented as complete figures as, for example, 80, 85 , . . . 100, 110, 120, . . . . Thus there is no separate selection of the first decimal, the second decimal etc. but there is only one data element "temperature". In the known apparatus to be able to select more than one data element it is necessary to have more keys, that is to say one key for each distinguished data element, the value of which has to be selectable separately. In these days in which the possibilities of handling great numbers of different data elements are increasing due to the fact that new developments in the field of electronics, as for example the microprocessor on one chip etc, create the circumstances therefor, it becomes a problem to be able to select all the values of these data elements. Straight forward there is no principal problem: just using more keys to be able to select the values in connection with the relevant data elements. Practically however there are boundaries such as costs, space on the control panel of the apparatus, reliability as to the safeguarding that all keys will operate without trouble for a long time. In this respect there are reasons to find out whether there is a solution for having a minimum number of keys with which a maximum of data elements, the value of which are to be selected, can be handled.

SUMMARY OF THE INVENTION

The device according to the invention metts this requirement, being characterized in that second register means are provided for registering and delivering to the first register means and to the display means indication information controlling which one of the data elements out of the group of data elements has its turn for value selection thereof, including third means to alter said indication information on repeated operation of the operation means so that subsequent data elements out of the group of data elements are prepared for value selection. By this second register means, also indicated as "pointer register", it is possible to select the values of as many data elements as large as there are sections in the pointer register. It is essential that by the third means in the pointer register the indication information (the "pointer") steps from section to section on the repeated operation of the operation means. Thus by repeated pressing of a key or button or touching a sense-key etc, the different data elements are prepared for value selection by the duration of the pressing of the operation means. In the example of the temperature selection it is possible with only one key to select: the value of the "hundreds" data element say 3; the value of the "tens" data element say 6; the value of the "ones" data element say 5. Thus by one key the complete set of values of data elements has been selected: 365.

As a matter of fact this invention relates to more than one type of data element. As already said above there are not only number values of parameters to be selected, but also the parameters, or functions themselves, for example, functions like: temperature, time, time duration period, weight, program number. The selection thereof takes place in the same manner as if it were different values of a number digit data element. The item "function" is the data element notation and the separate functions temperature, time, . . . are the different values of this data element. For each of these values it is further possible to select the different values of data elements which as a (decimal) number ae to be used in combination with a selected function. To encounter this situation with more than one type of data element in the group of data elements, the device is according to the invention characterized in that a group of data elements comprising at least two different types of data elements, each type comprising one or more data elements (e.g. numeric data, commands and/or alpha-numeric data words), the first register means being adapted for registering and delivering to display means, being adapted for such displaying, selectable values of data elements of the different types of data elements and whereby the second register means being adapted for registering and delivering to the first register means and to the display means predetermined indication information for data elements of the different types of data elements the values of which are to be selected subsequently.

Having many data elements and in particular having also a number of different types of data elements it is necessary to make a good choice as to how many operation means have to be provided to be able to select those items (with the corresponding values) which have to be selected in a certain case (for a certain application) in an efficient and convenient way, but still holding in mind what is said above with respect to the costs, space on the panel etc. The device according to the invention makes possible that choice by mixing up the typical features of the invention and therefor the device is characterized in that for each data element of a first type of data elements out of a group of data elements a separate operation means is provided, further comprising separate register means for registering and display means for displaying selected values of data elements of the first type of data elements and multiplexing means for selecting values of data elements of a second type of data elements usable in connection with the data elements of the first type of data elements, by which multiplexing means for each selected value of a data element of the first type, the first and second register means being repeatedly used on the subsequently repeated operation of a separate operation means for selecting said values of data elements of the second type of data elements. In particular when selecting (decimal) number values of data elements it is advantageous that a simple correction feature is built into the device according to the invention. Simple correction is possible by having a partial erase provision in the device. In case of decimal numbers it is understandable that for inputting new numbers it is convenient to start selecting the values from left to right, that is to say first selecting the value of the most important digit and going on to the least significant digit. In correcting it is more feasable to be able to erase the least significant digit first, because it is most likely that a correction has to be made in that position. If not, the procedure proceeds further, going from right to left through the values of the subsequent more significant digits. To have this feature realized in the device being subject of this patent application, it is furthermore characterized in that it comprises fourth means for detecting whether values of data elements of at least one type of data elements have been selected, if no: the fourth means placing the indication information at and controlling the alteration thereof from one side of the second register means (increment from the most significant data element of the type of data elements); if yes: said fourth means preparing to place and on a command from a further operation means placing the indication information at and on continued operation of the further operation means controlling the alteration thereof from the other side of the second register means (decrement from the least significant data element) erasing subsequent values of earlier selected data elements from the first register means and the display means and after which commands the erased values of the data elements being reselectable. A further typical kind of data element should have more emphasis namely a command which is useful in connection with the transfer of selected values of data elements to further devices in which the values are processed or handled. This command ("ENTER") can be considered to have two values: "go" and "no-go". To have this feature built into the device of this patent application, it is characterized in that the second register means is extended with one more section adapted for receiving indication information after first having obtained a value of a data ellement or a complete set of values of a plurality of data elements in the first register means and displayed on the corresponding display means, the indication information in the additional section serving as a command signal for controlling the value or complete set of values to be offered for transfer or transferred to a device using the data element values. This ENTER command can be released automatically after some delay period after the selection of the complete set of data elements has taken place or upon one more operation of an operation means.

In areas of apparatus and systems in which the above described device can be used, nowadays more and more use is made of data processing devices which can handle and process a lot of input data for a wide range of all types of applications: not only for computer, terminal, industrial and further professional applications, but also for all types of consumer applications such as television, household appliances etc. As a matter of fact it is even feasable to explore the possibilities of using a microprocessor in a device according to this application. By doing that the selection as such does not change from a user point of view, only the way of implementing it differs. Therefore, the device for selecting values of data elements forming part of a group of data elements comprising an operation means, display means and first register function means for registering and delivering values of data elements to the display means; the operation means, dependent upon the time that means is operated, causing the selection of a value of a data element through the registering and displaying of subsequent values of the data element, is characterized in that it comprises a programmable digit signal processor emulating the first register function means and further emulating second register function means for registering and delivering to the first register means and to the display means indication information controlling which one of the data elements out of the group of data elements has its turn for value selection, comprising third function means to alter the indication information on a repeated operation of the operation means so that subsequent data elements out of the group of data elements are prepared for value selection.

For encountering the situation in which more than one type of data element have to be selectable, the device with the programmable digital signal processor is characterized in that a group of data elements comprising at least two different types of data elements, each type comprising one or more data elements, (e.g. numeric data, commands and/or alpha-numeric data words), in the digital signal processor the emulated first register function means being adapted for registering and delivering to the display means, being adapted for such displaying, selectable values of data elements of the different types of data elements and whereby in the programmable digital processor means the emulated second register function means being adapted for registering and delivering to the first register function means and to the display means predetermined indication information for data elements of the different types of data elements the values of which are to be selected subsequently.

To meet the requirement for making a good choice of how many operation means have to be provided in a certain application area with respect to the number of different data elements the values of which are to be selectable, the device with the programmable digital signal processor is characterized in that for each data element of a first type of data elements out of a group of data elements a separate operation means is provided, the programmable digital signal processor further emulating separate register function means for registering, and there being provided display means for displaying selected values of data elements of the first type of data elements and the programmable digital signal processor further emulating multiplexing function means for selecting values of data elements of a second type of data elements usable in connection with the data elements of the first type of data elements, by which multiplexing function means for each selected value of a data element of the first register the first and second register means being repeatedly used on the subsequently repeated operation of a separate operation means for selecting the value of data elements of the second type of data elements.

With respect to the correction feature referred to above, to implement this feature in the device with the programmable digital signal processor, the device is characterized in that the programmable digital signal processor implies emulates fourth function means for detecting whether values of data elements of at least one type of data elements have been selected, if no: the fourth function means placing the indication information at and controlling the alteration thereof from one side of the second register function means (increment from the most significant data element of the type of data elements), if yes: the fourth function means preparing to place and on a command from a further operation means placing the indication information at and on continued operation of the further operation means controlling the alteration thereof from the other side of the second register function means (decrement from the least significant data element), erasing subsequent values of earlier selected data elements from the first register function means and the display means and after which commands the erased values of the data elements being reselectable.

As to the ENTER-command being considered a typical data element in the programmable digital signal processor, said implied second register function means is extended with one more section adapted for receiving indication information in the first register function means and displayed on the corresponding display means, after first having obtained a value of a data element or a complete set of values of a plurality of data elements, the indication information in the additional section serving as a signal controlling said value or complete set of values to be offered for transfer or transferred to a device using the data element values.

The device in both its hardware and programmable processor implementation will be described in detail hereinafter with reference to the drawings in which in the figures a number of different aspects of the invention are shown. It is to be noted however that this description is merely a sample from the multitude of possibilities and that the invention is by no way restricted to these examples.

DESCRIPTION OF THE PREFERRED EMBODIMENTS

Figure 1:
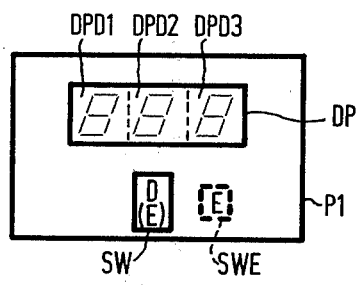
FIG. 1 to FIG. 5 show panel outlooks for a number of different embodiments of devices according to the invention.

In the Figures the same items and components are indicated with the same reference characters as far as feasable.

In FIG. 1 to FIG. 5 a number of panels P1, P2, ... P5 are shown. These panels can be used as input control panels for a number of different embodiments of devices according to the invention. In these FIGS. 1 to 5 SW stands for operation means. SW ... (with some added letter such as E, F ... ) means also operation means. DP stands for display means.

In FIG. 1 the panel P1 refers to a "D" (=digit) selection device. The data elements are: the decimal "ones" to be selected and to be displayed on part DPD3 of the display means DP; the decimal "tens" on part DPD2 and the decimal "hundreds" on part DPD1. The square "D" denotes a knob (switch or the like) SW with which the subsequent values the data elements are to be selected. Dotted square "E" denotes an ENTER-command switch SWE, but "E" may also been handled by switch SW (see D (E) notation). The selection procedure is as follows: pressing knob D the first time, the most left digit is selected: at DPD1 the values of the "hundreds" run 0, 1, 2, ... 9. Dependent upon how long D is pressed, one of these values will be selected, say "3". After repeated pressing the knob, now the middle digit is selected: at DPD2 the values of the "tens" run 0, 1, ... 9. Ceasing to press the knob D selects one of these values, say "6". By pressing the knob D again, the "ones"-value is selectable. If by reaching "5" on DPD3, the knob D is released, on DP the number "365" is selected. If this number is acceptable, the user will allow it to be entered into a device, apparatus or system in which the number is to be used. This entering can be done by the ENTER-command E. Pressing knob SWE the number on DP enables the transfer. On the other hand making further use of the invention by again pressing switch SW ("DE") the command "go" for ENTER can be given. This may be displayed on P1 by, for example, lighting of the switch SW by a built-in lamp.

Figure 2:
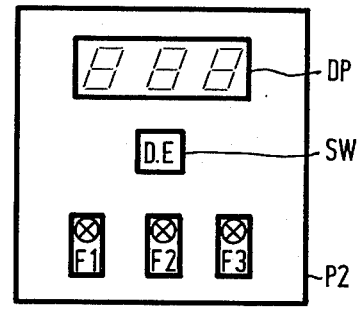

In FIG. 2 the panel P2 refers to a "D" (=digit) and "E" (=ENTER-command) selection device for a number of different functions F1, F2, ... which each are selectable by a separate switch denoted with these F1, F2, .... In this case the procedure is much like that of FIG. 1: having pressed button F1 (a lamp in this buttom indicates the selected function), function F1 is selected. For this function F1 the different values of the subsequent data elements displayed on DP will be selected by repeated pressing of switch SW ("DE" notation). At the end these values are available for entering or transfer to a further apparatus. The same can be done for function F2 and so on. Thus for m functions F1, ..., Fm, there are only needed m+1 switches to select these functions together with the digit values (n digits) thereof and even the control command for transferring or offering for transfer the selected values.

Figure 3:
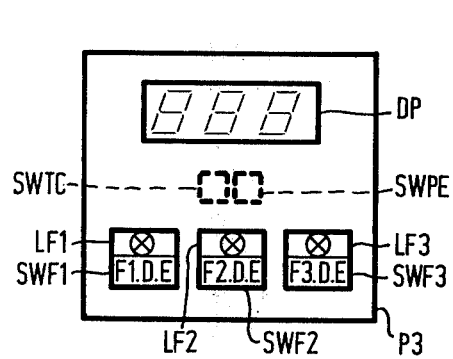

In FIG. 3 a panel P3 is shown. This panel comprises switches SWF1, SWF2, ... with notations F1.D.E., F2.D.E, .... With these switches the following selection procedure is possible: operating switch SWFi first of all function Fi is selected, that is to say in the notation used in this description: of data element Fi the value "go" has been selected. After a second operating of switch SWFi the value of the most significant (decimal) digit (thus of another type of data element which is usable in connection with the function just choosen) is selected and so on, including the ENTER-command. In the relevant switches SWFi a lamp-indicator LFi is shown. These lamps LFi indicate whether a function value "go" has been selected. For example, after entering of the function with its accompanying digit values, the relevant lamp indicator is switched off, or a separate display indication may be provided for. With this panel different types of data elements are handled by only one switch and in particular here for m functions there are only m operation means needed. Only for illustrating features which will be described in full detail hereunder, in FIG. 3 two further operation means are shown: SWTC (button for a total clearance of what has been selected) and SWPE (button for a partial erasure of one or more values of one or more data elements). These operation means can also be provided in the other shown examples FIG. 1 to FIG. 5.

Figure 4:
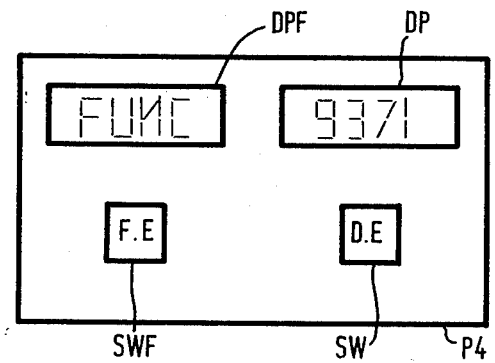

In FIG. 4 a further possible panel P4 outlook is shown. With switch SWF a selection of a certain function out of a series of function names is possible. In the notation used: "function" stands for data element and the values thereof are the functions (denoted by their names) themselves. On display means DPF the "function-values" are displayed the one after the other so long as SWF is actuated. After having made a function selection, by a repeated actuation of SWF the relevant function is entered: see notation "F.E.". The same applies here for the digit selection in which not for only one data element but for more (4 are shown). The values are selected by repeated operation of switch SW. After agreement with the chosen values, the ENTER command can be given by again operating said switch SW with notation. "D.E.". In this case only two operation means are needed for m functions each having up to a maximum of n digits (n depends on the display capacity).

Figure 5:
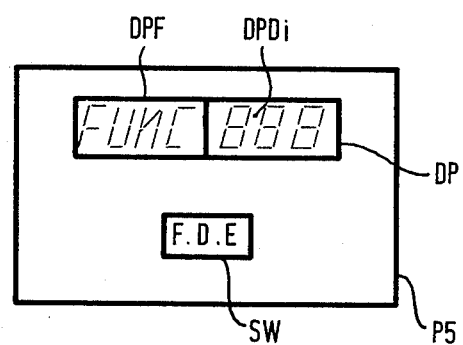

In FIG. 5 panel P5 is shown. Here only one operation means is provided for doing all selection activities. The display means DP consists of one screen or separate screens DPF (for the function notations) and DPD (for the digits). All types of display means are possible: light emitting diodes, liquid crystals, gas discharge etc. up to cathode ray tube displays. This applies of course also for the panels shown in FIGS. 1, 2, 3 and 4. In FIG. 5 with SW notation F.D.E. it is indicated that two different types of data elements F and D are selectable. Of these, D has a number of data elements (digits), the values of which are to be selected. For F there is only one data element, the values of which are the functions themselves. E the ENTER command may be considered to be a data element too: it has two values "go" and "no-go". After the complete procedure for a first series of selections (say for example "Temp". "250". "E") a second procedure can start (say for example "Weight". "1,5". "E" and so on. All this with only one operation means SW with notation F.D.E.

It should be noted that there are more possibilities with the set-up described above. Only one more will be indicated here: the function selection may also be done as follows: Suppose the function as a type of data element has a number of data elements, for example 4. The values of these data elements (which are characters or even may be digits) have to be selected one after the other (as for decimal numbers having also 4 m digits). Thus to select the function "TIME", the values of the first data element referring to the first character will pass over the display: A, B, . . . T, . . . Z. At T the operation means is released and "T" is held on the display. By actuating the operation means again, for the second character the A, . . . H,I, will be presented.. Stop at "I" and so on until the complete function name has been selected. After that with the same operation means digit values usable in connection with the selected function may be selected and so on.

Figure 6:
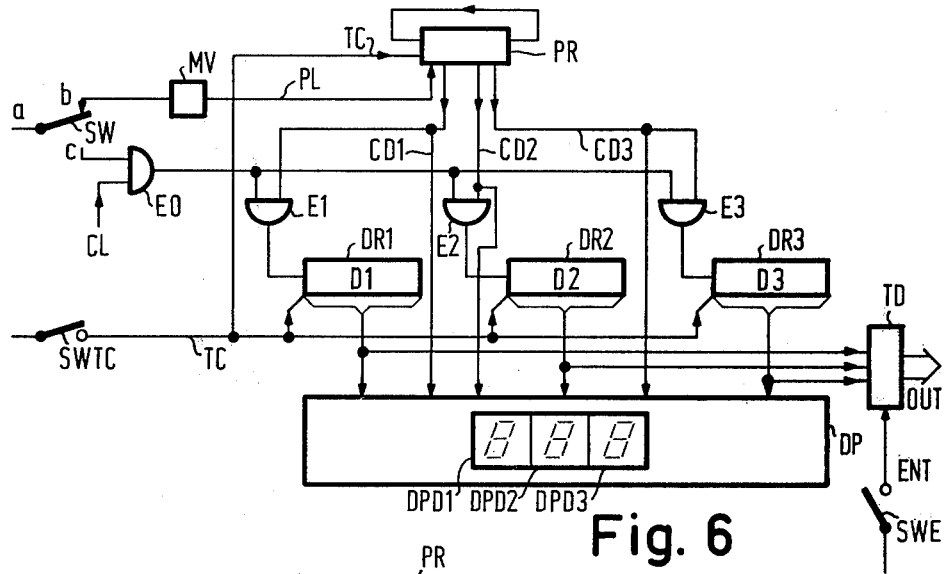
FIG. 6 shows a device according to the invention.

In FIG. 6 a device according to the invention is shown which can be used with the panel P1 shown in FIG. 1. The ENTER command is considered to be separate here: SWE switch. In FIG. 6 SW is the operation means for selecting values of a number of data elements, here being indicated as digits. SW is normal in its position indicated with b. The first register means are registers DR1, DR2 and DR3 for registering and delivering to display means DP values of the relevant digits D1, D2 and D3. Of DP the sections DPD1, DPD2 and DPD3 are adapted for displaying these digit values. Second register means is indicated by PR, the pointer register, for registering and delivering via AND-function gates E1, E2 and E3 respectively to registers DR1, DR2 and DR3 and also delivering to the display DP indication information (pointer position in register PR) controlling which one of the data elements (digits in this case) has its turn to select the value thereof. A monostable multivibrator MV serves as the third means to alter the indication information (i.e. shifts the pointer in PR) on a repeated actuation of the switch SW. By this, subsequent data elements (digits) are prepared for value selection. The further operation is as follows: closing switch SW (position c), through AND-gate EO prepared by signal input a via SW, clock pulses CL (having a rate, for example, of one per second) are delivered at the inputs of E1, E2 and E3. Starting from an initial state, pointer register PR will be at its first position: pointer is most left in FIG. 6. By this, line CD1 will carry a logical 1-signal, thus E1 is prepared to let the clock pulse CL through. Register DR1 runs on these clock pulses coming into it. At the same time through the 1-signal on CD1 display part DPD1 is active. According to known techniques DPD1 displays numerical values 0, 1, . . . 9, one after the other, on the subsequent Cl pulses. At the moment SW is released (arrives at position b), the cycling through the numeric values is stopped, for example at "3". This "3" remains in DR1 and on DPD1. The switch SW arriving at b causes mono-stable multivibrator MV to generate a pulse, which is delivered to PR over line PL. Herewith PR steps one step: the pointer arrives at its second position. This means line CD2 carries a logical 1-signal. Now gate E2 is prepared. Actuating switch SW again (position c) starts the cycling of the second data element (digit) in register DR2 which is also displayed on DPD2 controlled by the 1-signal on line CD2. Having reached the requested value, switch SW is released again and therewith the second digit has been selected. SW arrives at position b again, thus causing MV to generate a new pulse for shifting the pointer in PR. Then CD3 carries a 1-signal to prepare gate E3. After having selected the third digit the pointer arrives again at its initial position. A complete number being selected, this can be offered for entering or entered into a further device: switch SWE when closed delivers the "ENT" command to a transfer device TD which takes care of the transfer of the contents of the registers DR1, DR2, DR3 to a further device (see "OUT"). This is known in the prior art.

Finally in FIG. 6 there is another switch shown: SWTC. This serves to clear the contents of all registers respectively to reset these registers to their initial states. The line TC indicates this ("total clear").

Figure 7:
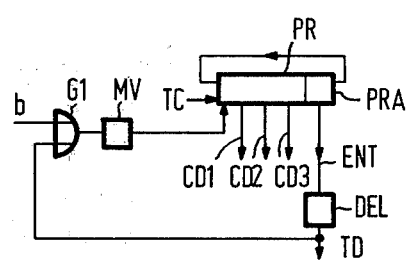
FIG. 7 shows a somewhat different device with an extension according to the invention.

In FIG. 7 it is shown how the device according to FIG. 6 can be extended to allow the ENT command to be generated automatically after the digits selection. The pointer register PR is extended by one section PRA so that after having completed the selection of the complete set of digits (compare FIG. 6) the pointer will arrive in this section PRA. In this example the pointer being in PRA serves as a logic 1-value indicating the ENTER command on line ENT. In this case due to a built-in delay DEL after a predetermined time period the ENT-command will arrive at the transfer device TD. This can be indicated by an indicator lamp if required. At the same time this ENT-command will also through OR-gate G1 arrive at MV, so that the pointer register then comes to its initial position. It should be clear that in this situation the ENTER-command is not given by an extra actuation of the switch SW. (For this case, see FIG. 8 in which such an extra actuation is necessary to get the ENTER-command).

Figure 8:
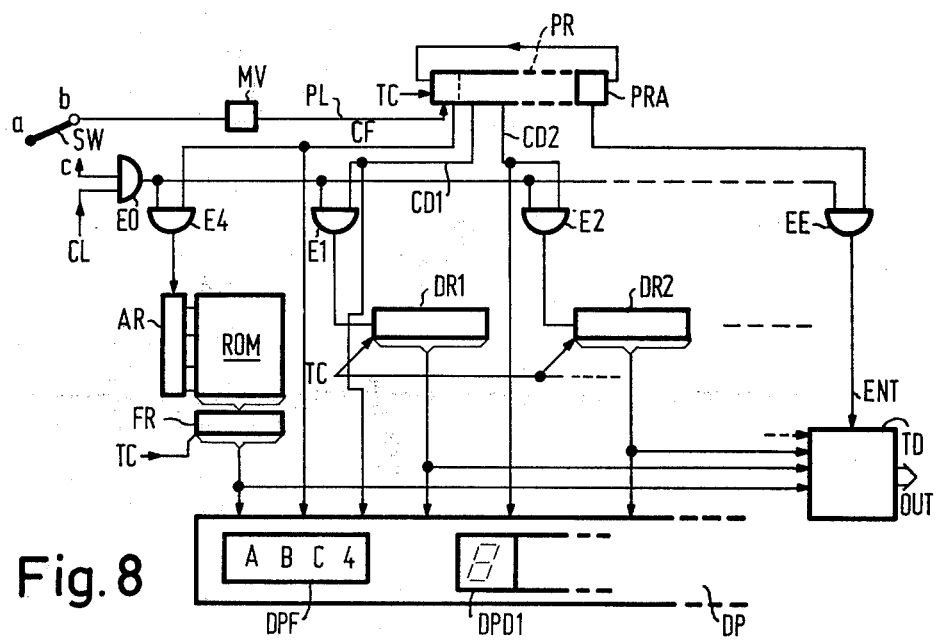
FIG. 8 shows a further embodiment of a device according to the invention.

In FIG. 8 a further embodiment according to the invention is shown. In this set-up the panel P5 of FIG. 5 can be used. Thus only one switch is used for all data elements even of different types; F.D.E. notation. In this example hereto, in the device according to FIG. 8, the first register means have been extended by an address register AR a read only memory ROM and a function name register FR. Display DP has now also function-name display means DPF.

The second register means PR has now a first section delivering a logical 1-value on line CF when the pointer is in the initial (leftmost) position of PR. AND-gate E4 is provided for gating CL-pulses to the address register AR when CF carries 1-signal. The procedure to select data elements and the values thereof is essentially the same as in FIG. 6. When SW is actuated the first time (closure to c) CL-pulses run through E4 to AR. By this, address-register ROM is addressed, one address after the other (for example with 1-second steps). ROM is read at such an address and the result comes into function register FR and furthermore into DPF. If the required function (as a value of the function type data element) is displayed, the actuation of SW will be stopped and the selected function will be held on the DPF and in the register FR. SW arrives at position b, and through MV register PR steps the pointer to the second left position: line CD1 carries 1-signal and at the next actuation of SW the first digit of the digit type of data elements will be selected etc. After all digits been chosen, the pointer arrives at PRA and the device is ready for the ENTER-command. In this example the ENTER-command has to be switched in by the user: upon an extra operation of SW (position c) a CL pulse runs through EE, which AND-gate has been prepared already by the pointer in PRA. Thus ENT is generated. All data inclusive of that of register FR is offered for transfer or transferred by device TD.

Figure 9:
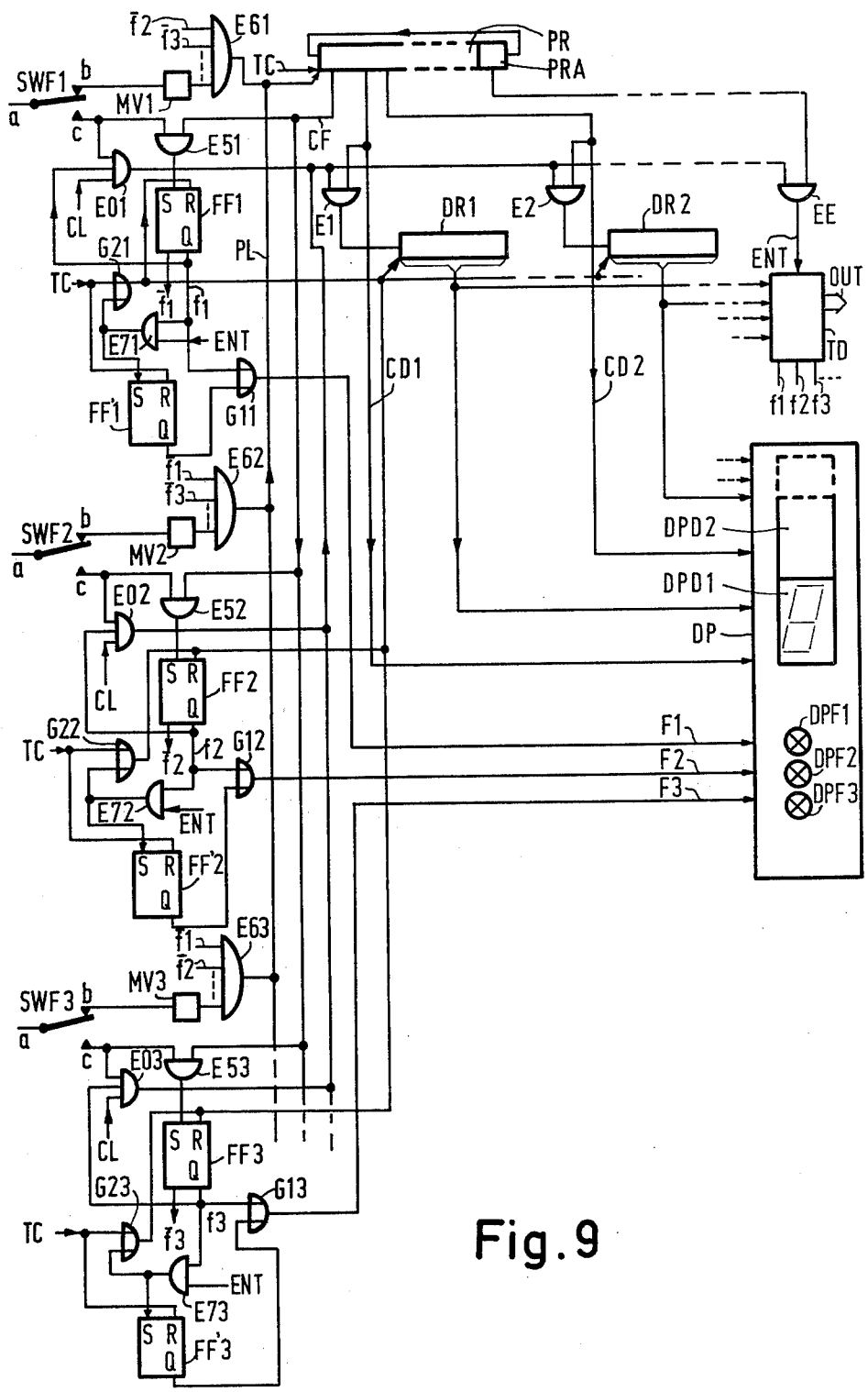
FIG. 9 shows a preferred embodiment of a device with separate operation means for each data element of a first type of data elements according to the invention.

In FIG. 9 a preferred embodiment of a device with separate operation means for each data element of a first type of data elements according to the invention is shown. Panel P3 of FIG. 3 can be used in relation with this embodiment. Operation means SWF1, SWF2, . . . are the separate operation means. Each data element of a first type of data elements has an operation means. The type is "function", the values of which can be "go", or "no-go". The different data elements of this type are the functions themselves. SWF1 applies for function F1 (for example time). SWF2 applies for function F2 (for example time duration). SWF3 applies for function F3 (for example temperature) and so on. For each of these functions values of a second type of data elements are to be selected, in particular decimal data element values. Finally for each set of information (function and its relevant decimal value) the ENTER command has to be generated. Compare here the Fi.D.E. notation on the buttons of FIG. 3.

The device according to FIG. 9 comprises (apart from the same components as already mentioned in connection with FIG. 6, FIG. 7 and FIG. 8) so called separate register means FF1, FF′1 for the part with SWF1, FF2, FF′2 for the part with SWF2 etc, for registering and display means DPF1, DPF2, . . . respectively for displaying selected values of data elements of the first type of data elements (F1, F2, . . . ). Furthermore the device comprises multiplexing means in the form of AND-function gates E51, E61 for the part with SWF1, E52, E62 for the part with SWF2 etc. In this example further gates are provided in connection with the separate register means: AND-function gate E71 and OR-function gate G21 for the part with SWF1, E72 and G22 for the part with SWF2 etc.

The functioning of this device is as follows: suppose with a signal on TC the device has been totally cleared and SWF1 is actuated for the first time. All FFi and FF′i (being flipflops in this example) are in their initial state, i.e. on outputs Q there is a logic 0-signal. Pointer register holds the pointer in the leftmost position; thus there is a logic 1-signal on line CF. AND-gate E51 is prepared. Closing SWF1 causes a pulse to be delivered through E51 to the set-input S of FF1 therewith line f1 carries a logic 1-signal. Through OR-gate G11 this signal arrives at the display means DPF1 via line F1. This indicates that function F1 "go"-value has been selected. Release of SWF1 causes a pulse to be generated in MV1. This pulse goes through E61 over line PL to the pointer register PR, so that PR shifts over one section to the right. Line CD1 becomes a logic 1-signal. The reason that the pulse from MV1 goes through E61 is because the further inputs on E61 carry logic 1-signal: $\overline{f2}$, $\overline{f3}$, . . . carry the inverse-signals of lines f2, f3, . . . which carry 0-signal due to the fact that FF2, FF3, . . . are still in their initial states. The same procedure now takes place as already has been described in relation to FIG. 6. The subsequent actuations of SWF1 cause the subsequent digits of the second type of data elements to be used in connection with the chosen function F1 (in case of time setting: a first data element having one of the values between 0 and 12 or 24, a second data element being, for example, the "tens" data element of the minutes etc.) to be selected.

Finally the pointer will reach section PRA of PR and the ENTER-command will be generated on the next actuation of SWF1: through AND-gate E01 (prepared by 1-signal on f1) a clockpulse CL arrives at an input of gate EE, which is already prepared by the pointer in PRA. On line ENT the command arrives at the transfer device TD. The contents of the first register means DR1, DR2, . . . together with the function F1 information (which may be a special code, activated for transfer by the 1-signal on f1 which is also connected to an input of TD) are offered for transfer or transferred to a further device over "OUT". In this embodiment the 1-signal on ENT also causes some more action in the device: through AND-gate E71, which is already prepared by 1-signal on f1, the flip-flop FF'1 will be set. Moreover through OR-gate G21 this 1-signal will reach the reset-input of flipflop FF1, thus causing FF1 to reset in its rest position. Through the setting of FF'1 its output Q carries 1-signal now. Through OR-gate G11 this results in maintaining a 1-signal on line F1, to indicate that function F1 has been selected before. Furthermore the 1-signal on ENT causes through the gate E71 and moreover through OR-gate G21 the clearing the contents of the registers DR1, DR2, . . . so that these are ready to receive new information. Now the device is ready to receive further functions/values to be selected. If SWF3 is actuated, the same procedure as above described will take place upon the repeated operation of SWF3. Of course depending on the type of data elements, the different values of each of them will have to be passed over the relevant separate register means, respectively over the first register means, which are usable again and again because of the multiplexing feature of the device.

Thus even independently of the sequence in which SWFi's are actuated, complete sets of different types of data elements with their relevant values can be selected using only a small number of operation means, namely as many as different types of functions (F1, F2, . . . ) are to be selected. This number is independent of the further number of data elements usable in connection with these functions and to be selected subsequently. Finally the ENTER command is also handled by the same number of operation means.

Figure 10:
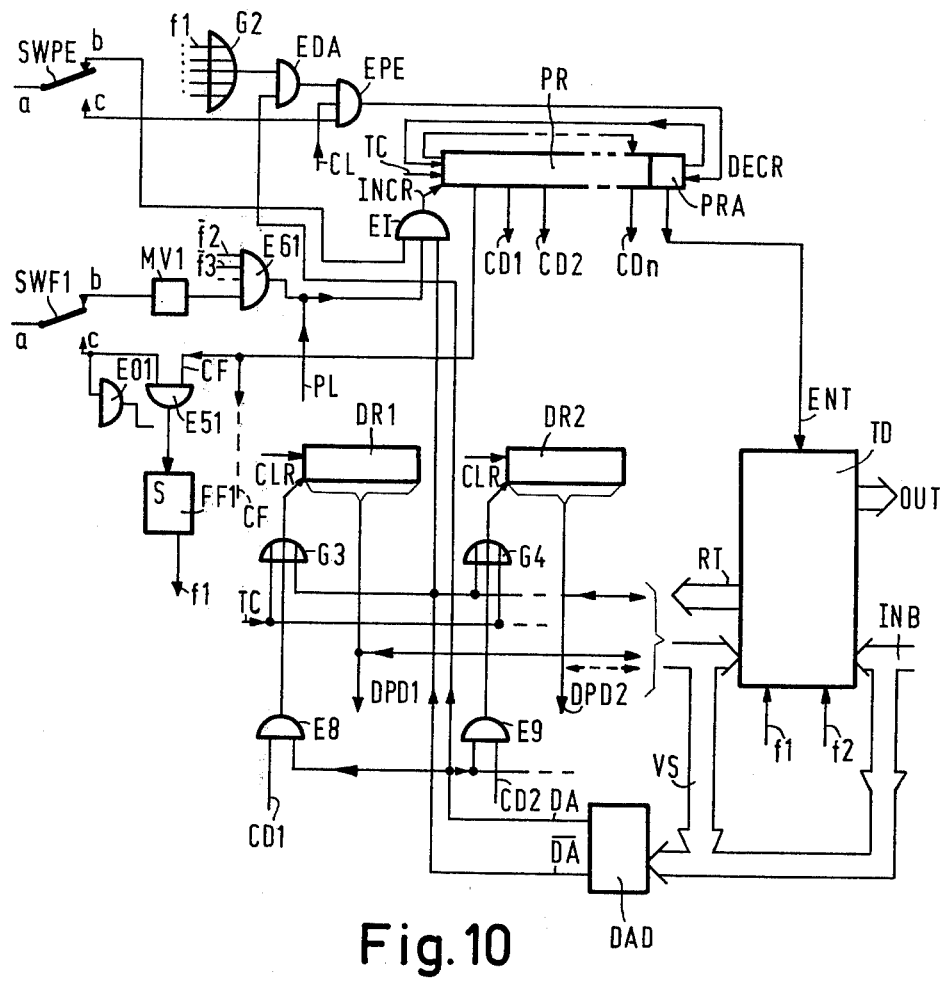
FIG. 10 shows a further extension of the device with erasure features according to the invention.

In FIG. 10 a further extension of the device with erasure features according to the invention is shown. In this example, this is shown as an extension to the embodiment according to the FIG. 9, but it also is applicable for other implementations. The device having fourth means comprising detector means DAD, AND-function gate means EI, EDA, EPE, E8, E9 . . . and OR-function gate means G2, G3, G4 . . . . Furthermore a further operation means SWPE (switch "partial erase") at position c, followed by OR-gate G2 and AND-gates EDA, EPE is present. The operation of this set-up is as follows: actuating in this example SWF1 (compare FIG. 9) causes function F1 to be selected. Line f1 carries 1-signal. At device TD f1 with 1-signal causes a request in TD. This request serves for requesting to receive from a further device (apparatus, system-part or the like) over an input bus INB information which eventually has already been selected and entered before. This information will come through transfer device TD back over inputs RT into the selection device. This is to say registers DR1, DR2 . . . will be filled from TD when earlier selected information is available. If not, no refilling of registers DR1, DR2 . . . will take place of course. The detector means DAD is not necessarily part of the device itself, but can also be part of a further device, further apparatus or the like, so that from there the detection result will come over INB to the selection device itself. In DAD it is detected whether earlier data is available: line $\overline{DA}$ carries logical 1-signal. If no earlier selected data is available line $\overline{DA}$ carries a logical 1-signal. First suppose DA carries a 1-signal: AND-gate EI is prepared and releasing the actuating of SWF1 causes a pulse from MV1, through E61, through EI to be delivered at the INCR-input of the pointer register PR. This INCR-input is the so-called increment-input of PR. With this, the pointer in pointer register PR starts running from left to right, thus first going from output CF to output CD1 and so on upon repeated operation of SWF1. In the meantime also line $\overline{DA}$ being connected to OR-gates G3, G4 . . . , the lines CLR connected to an input of DR1, DR2 . . . respectively, carry 1-signal. This causes the registers DR1, DR2, . . . to be cleared (in case some kind of irrelevant data was left). The selection procedure is furthermore the same as already been described with reference to FIG. 9.

When line DA carries 1-signal there is valid data available, this 1-signal will arrive at an input of AND-gate EDA. By one of the function F1, F2 . . . being selected (see above), through OR-gate G2, the said AND-gate EA is prepared and conducts the said 1-signal to an input of AND-gate EPE. If at this time, the operator of the device wants to correct one or more values being registered in DR1, Dr2, . . . , he is able to do that as follows: operating the "partial erase" switch SWPE (position "c"), gate EPE is further prepared to allow through clock pulses CL (say 1 per second or so). With this pulse(s) the following occurs. Input DECR of register PR is activated and the pointer being in the most left section of PR will be placed at the most right (excluded the PRA section) section of PR. From this position, depending upon how long SWPE is actuated and thus in its "c" position, the pointer runs from right to left through PR. ("Decrement mode"). During this decrementing subsequently the output lines CDn, CDn-1, . . . CD2, CD1 will carry a logical 1-signal. This signal on CD2, will cause clearing the register DR through AND-gate E9 and OR-gate G4. Depending how long SWPE is actuated on position "c" subsequent values in subsequent registers DRn, . . . DR2 are erased in the order starting from the least significant data element of this type of data elements (c.f. digits). At the moment the operator stops operating SWPE this switch comes in its "b" position. Because "b" is connected with a further input of AND-gate EI, this EI is prepared to the INCRement input of PR. That is to say when the operator operates SWF1 again the relevant values of the relevent data element will start running in that DRi at which the decrement action was stopped. Here the operator is able to select a new value of that data element. Release of SWF1 after such selection causes (position "b" of SWF1) a pulse from MV1, through E61 and EI to arrive at the INCR-input of PR, so that the pointer shifts one section to the right again. Now selection of a value for data element in DRi+1 is possible and so on. It should be remarked that before entering a set of data element values to a further device or so, it is possible to do this correction procedure. When the operator sees that the values selected are not correct, he will not press SWF1 to generate the ENT-command, but he will press the SWPE button. Because of the fact that in DAD the already selected information arrived through bus VS causes a 1-signal at the DA output thereof, the DECRement action can take place. Thus the same situation arises as described already above.

To summarize: an actuating of SWPE causes the cancellation of a number of already selected values of a type of data elements, namely as many as the operator feels are incorrect. Stopping to actuate SWPE and actuating SWF1 again he can reselect the cancelled values. Example: say a number "1234" has been selected. Pressing SWPE he cancels 1 2. After actuating SWF1 (for that Fi) he reselects then the values for the third and fourth position (the "tens" and "ones" digit respectively). Result for example "1250".

Figure 11:
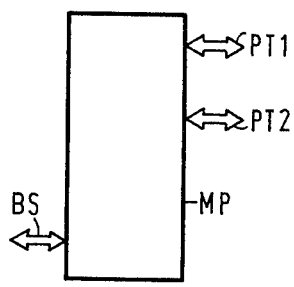
FIG. 11 shows a symbol of a programmable digital signal processor.

In FIG. 11 the logic symbol of a, in this example, micro-processor MP is shown. Such micro-processors are known in the prior art and the way to use these are also known. A technician skilled in the art of micro-processors is able to implement such a micro-processor as to get a device according to the invention comprising a programmable digital signal processor. In the description which follows, the set-up of using a micro-processor is given in more detail, in particular with the help of flow-diagrams. The example of the micro-processor chosen for that purpose is the 8048, manufactured by Intel Corporation and described in the 1978 Component Data Catalog of Intel, pages 10-10 through 10-17. The MP of FIG. 11 is characterized by having a data bus BS, a first port PT1 and a second port PT2. These inputs/outputs of the MP are relevant for the implementation of the selection device.

In the following description a detailed explanation is given of the device which above has already been described with reference to FIG. 3, FIG. 9 and FIG. 10. It should be remarked here again that the invention is not in any way limited to this example of the selection device comprising a programmable digital signal processor. By fully explaining this example it is possible for a man skilled in the art to create variations, the background of which has already been fully explained with reference to the above part of the description.

Figures 12, 13:
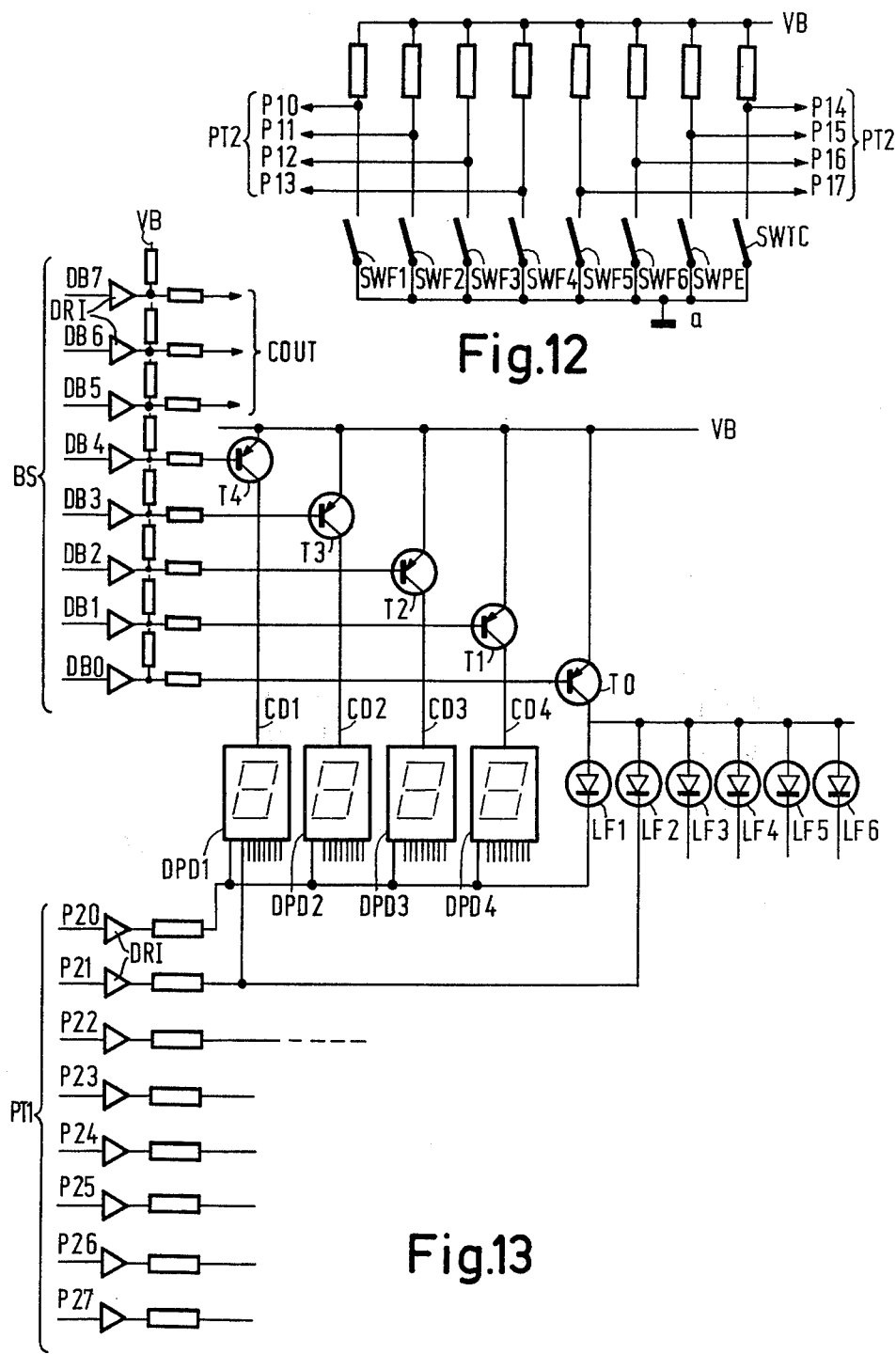
FIG. 12 shows operation means connections to a port of said processor of FIG. 11.
FIG. 13 shows display means connections to said processor of FIG. 11.

In FIG. 12 it is shown how the operation means (compare FIG. 9) SWF1, SWF2, . . . SWF6 for selecting functions F1, . . . F6 which their appropriate values of data elements to be used in connection therewith and for generating the ENTER-command, are arranged and connected to the inputs of P10–P15 of the second port PT2 of MP(FIG. 11). Furthermore also operation means SWPE for the "partial erase" feature and the "total clear" operation means SWTC are connected to MP via inputs P16 and P17 respectively of said port PT2.

In FIG. 13 it is shown how the information as a result of the processing and handling of the operation means actuations by the micro-processor, is transferred to the display means. This occurs by the data bus BS with outputs DB0, DB1, . . . DB7 and by the first port PT1 with connections P20, P21, . . . P27. In this example the signals arrive at the display means via driver circuits DRI. VB is a supply voltage. The display means are LF1, LF2, . . . LF6 for the display of selected functions F1, . . . F6 and DPD1, . . . DPD4 for the digit values selected in connection with these functions (displayed for each function so selected). DPDi is a segment display with seven character segments and one pointer segment. LFi is a lamp. The display control is as follows: one of the outputs DB0, . . . DB4 carrying a logical 1-signal causes the transistors T0, . . . T4 to conduct. At the same time controlled by the MP one or more of the port PT1 connections P20, . . . or P27 carry a logical 1-signal, so that the relevant digit decimal value is presented to the display. Which of DBi carries 1-signal depends upon which position the pointer in the pointer register (i.e. a relevant pointer register function means in the MP) stands. In FIG. 13 the notations CD1, CD2, CD3 and CD4 are used to show where the matching with earlier figures, c.f. FIG. 9, takes place. It should be clear that the number of connections to realize all actions to be done in the display means is sufficient because at least a number of these connections are used in multiplex mode, causing a continuous scanning of the individual display parts. This is commonly known in the art. The COUT connected to DB5, DB6, DB7 of BS refers to the connections from the MP to a further device, apparatus or system which is controlled by the MP, for example, an industrial process apparatus, or a measuring system, or a household appliance such as an oven etc.

Figure 14:
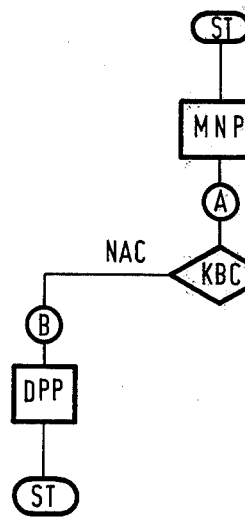
FIGS. 14 to 17 show examples of flow diagrams illustrating the selection in a device with a programmable digital signal processor according to the invention.
Figure 15:
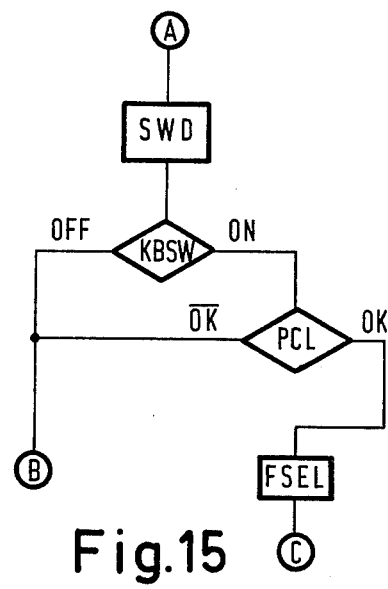

FIG. 14 to FIG. 17 show a number of examples of flow diagrams to illustrate the selection in a device with a programmable digital signal processor (here a microprocessor) according to the invention. FIG. 14 shows a general set-up: ST refers to "start". MNP refers to the main program carried out by the MP for the kind of apparatus or system used, besides the use of it in connection with the selection according to this invention.

Circled character indications refer to program branches. According to FIG. 14 in KBC the keyboard control is checked: is there action "AC" or is there no action "NAC". If yes, branch C is reached and the operation program for the selection OPL is made active. Thereafter it reaches start ST again. If there is no action "NAC" branch B is reached and the normal display program DPP is active. According to FIG. 15 if there is an operation active in branch A, first of all a switch activation SWD is foreseen. If this results in the recognition by KBSW that really a switch has been actuated in a proper manner via "ON" the program checks by PCL whether the code pattern of said actuation falls within predetermined constraints. If that is "OK", then the function selection is governed by FSEL and the program reaches branch C. If there is no proper actuation of a switch, via "OFF" the program reaches again branch B (see FIG. 13). The same applies if the pattern check does result in a not-"OK"=$\overline{OK}$ situation.

Figure 16:
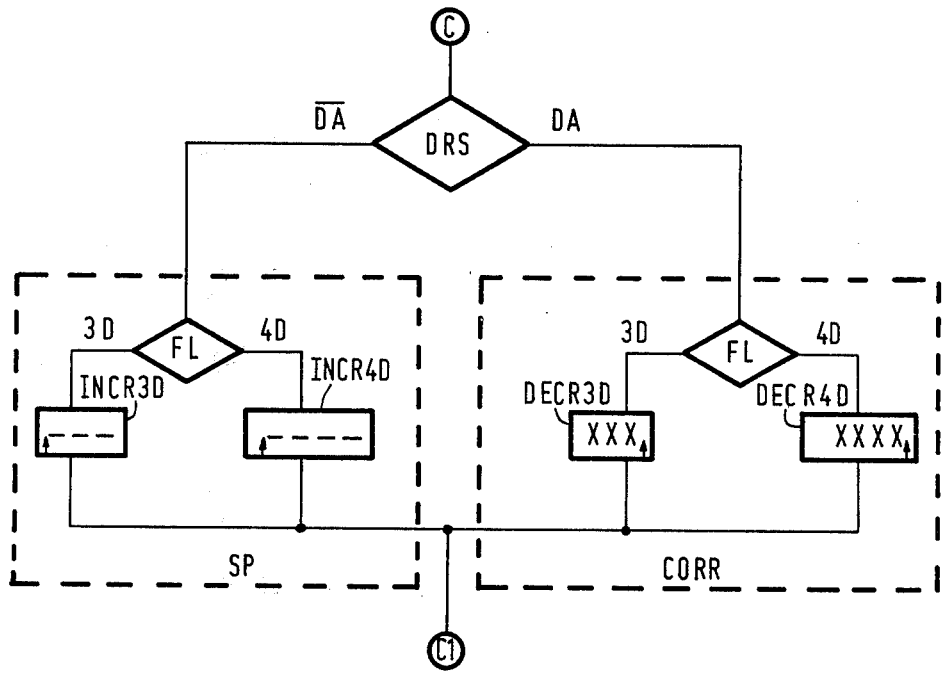

In FIG. 16 the flow diagram refers to the implementation or emulation of the functions of said first register means, said second register means and said third means shown in earlier FIG. 6 etc. The meaning of this flow diagram is the following: the program being in branch C checks by DRS (looking into data-registers) whether there is data "DA" or no data "$\overline{DA}$" (compare DAD in FIG. 10). If there is no data the program, by section SP controls the first selection of values of data elements usable in connection with the function already selected. In this example it is shown that there is a plurality of possibilities how to display, in this example, decimal digit values. By FL it is checked whether for the selected function the maximum number of decimal digits is 3 or 4: 3D or 4D. After that the program arrives in INCR3D or INCR4D respectively. Here the situation has been reached that (because of $\overline{DA}$) the pointer points to the leftmost digit place. This is shown with the arrows extreme left in squares INCR3D and INCR4D. Selection of values means that the arrow (= pointer) shifts to the right: increment procedure.

If on the other hand there is data, DA is true, then the program reaches th "CORR" part, i.e. a correction of said data can be made. This refers to the fourth function means. The erase feature applies now. In the same way as for SP again in FL (or CORR) the maximum number of (decimal) digits will be checked: 3D or 4D. After that the correction program arrives at DECR3D or DECR4D respectively. The pointer points to the right position at the least significant digit places. This is shown with the arrows extreme right in the squares with notation DECR3D, DECR4D respectively. Actuation of the erase switch causes the arrow to run to the left over as many digits as the operator wants by holding the erase switch SWPE actuated.

Figure 17:
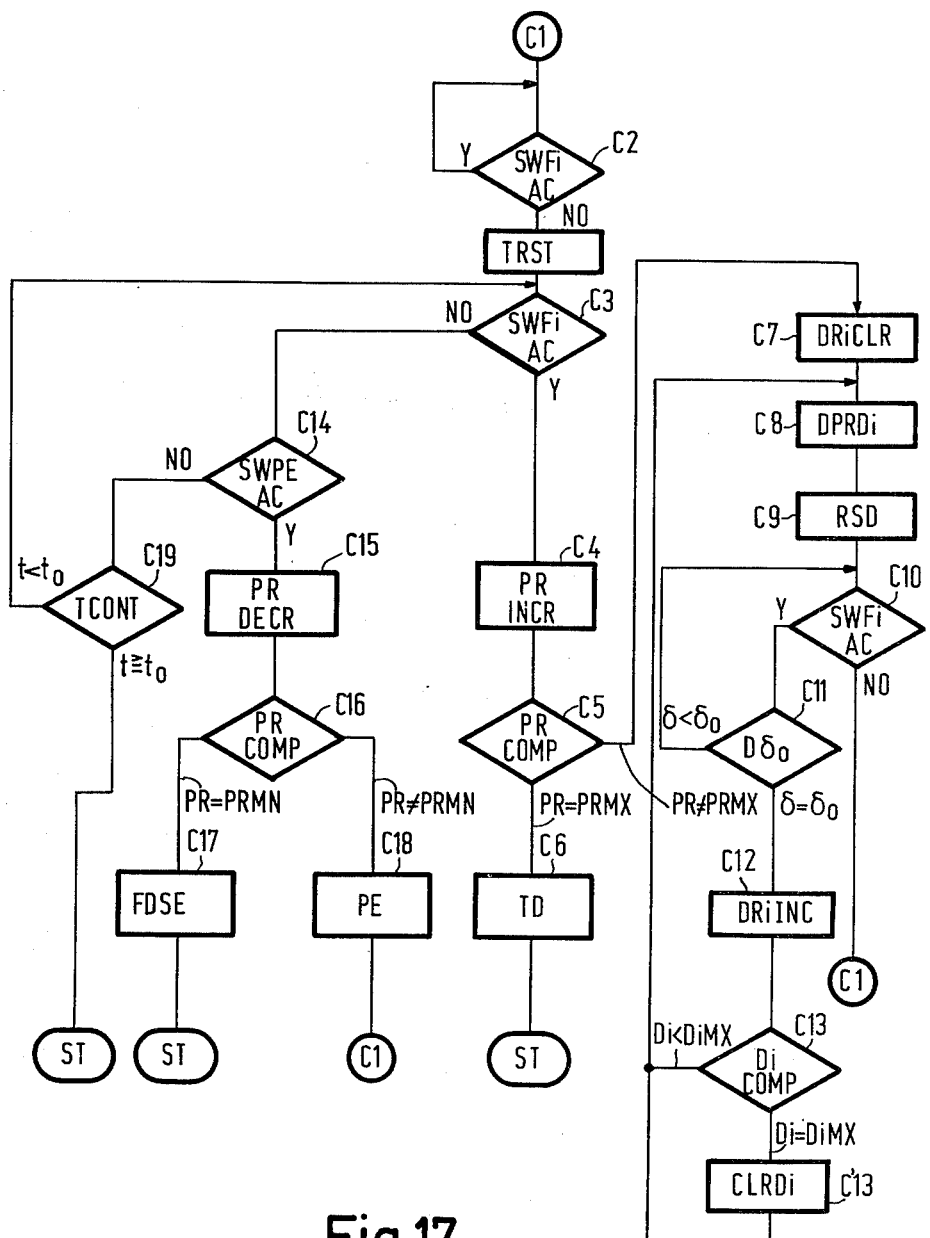

In FIG. 17 it is shown how the decimal digits selection and, as the case may be, the erasure thereof takes place according to the programmed micro-processor MP (FIG. 11). After the program, according to FIG. 16 has arrived at C1, from this point on, FIG. 17 shows the following: In C2 it is checked whether a switch SWFi is actuated: "SWFi AC". If yes, this means that the relevant Fi is selected (branch C in FIG. 15 and FIG. 16) and the switch is still actuated. Here it is possible to let the display lamp flicker for Fi: LFi. If SWFi is released then C2 delivers "NO" and a timer, which controls this part of the procedure with respect to time, is reset in an initial position. Then in C3 there is searched whether the said switch SWFi is actuated again: "SWFi AC". If no, then by C14 it is checked whether the partial erase switch is actuated "SWPE AC". If also here "NO" occurs, then in C19 it is checked whether the timer has reached a predetermined position to: "TCONT". If no, thus t<to, the described loop consisting of C3, C14, C19 continues to run. If nothing happens within the time period to, thus t≧to occurs, to be detected at C19 then the program returns to its start ST position. If however in C14 it appears that switch SWPE is actuated, then the procedure continues at C15. Here the DECRement action takes place. The pointer starts to run from right to left, depending upon how long SWPE is actuated by the operator. In C16 it is checked whether the pointer reaches the rightmost position (i.e. the position where the most significant digit is indicated) or not: "PRCOMP" delivering PR≠PRMN (pointer not yet at so-called minimum position) or PR=PRMN (pointer is at minimum position). If the operator stops actuating SWPE before the minimum position only a part of the digits has been erased ("partial erase"PE) and this causes the program through C18 "PE" to continue at C1 again. This means that from that position the normal (re-)selection of the cancelled digit values can take place, as will be explained hereinafter. When on the other hand in C16 PR=PRMN is reached then through C17, besides the erasure of the total of the digit values for that Fi, also the selection of Fi itself is cancelled. Thus erasure of a function with its digit values has occurred: "FDSE". The program returns to the start position ST again.

Selection, or reselection of digit values is carried out as follows: by C3 it will be detected that SWFi is actuated. The program continues at C4. The pointer register comes in its INCRement mode: "PRINCR". In C5 it is checked whether the pointer is already at its maximum (here the most right digit position or not: PR=PRMX or PR≠PRMX respectively. If yes then the complete set of digits relevant for said Fi has been selected and is ready for transfer: C6 "TD" (please compare TD transfer device in for example FIG. 7). In this set-up it is foreseen that after a predetermined delay the complete set will be transferred, as has been explained with reference to the example according to FIG. 7. After that C6 the program arrives again in its start ST position. As long as PR≠PRMX the digits selection is carried out: C7-C'13-C1 (right part of FIG. 17). First, by C7 the contents of relevant register function means DRi is cleared: DRiCLR. The contents of the register function means DRi is transferred to the display: a display register "DPRDi" (C8). If the program comes from C7: nothing will be displayed (or only a reference mark, denoting that there is no value chosen yet. By C9 a delay is reset "RSD". By C10 it is checked again whether SWFi is still actuated "SWFi AC". If no the program returns to C1 again. If yes, the program arrives at C11. There it is checked whether a minimum delay δ0, during which the SWFi is actuated has been passed: "Dδ0". If no, "δ<δ0" the program runs in the loop C10-C11. If δ=δ0 then by C12 the contents of the digit register DRi undergoes an increment "DRiINC". This means the contents becomes "0" (in case the first step occurs) or becomes "1", "2" or . . . . By C13 it is checked whether these contents reach a relevant maximum: "DiCOMP" checks Di=DiMX or Di≠DiMX. This is done to be able to set predetermined maxima of certain digits. For example if, in case of an oven, the temperature cannot exceed say 399° C. then Di for the most significant digit has its maximum at "4". This "4" cannot be accepted, thus will be cleared by C'13: "CLRDi". From C13 (or C'13 giving a non-value mark), the program will fill the display register "DPRDi" (C8). The loop C8, C9, . . . C13 (C'13) occurs as many times nδ0 the operator continues to let SWFi actuated. The digit values are running: 1,2 . . . etc. It is also possible that the values are 0,5 in case that for example for the least significant digits only values "0" or "5" are relevant etc. At the moment the operator stops actuation of SWFi (C10) the program arrives at C1 again as already said above. Repeated actuation of SWFi causes the next digits (if any) to be selected.

What is claimed is:

1. Device for selecting values of data elements forming part of a group of data elements, said group of data elements including at least two different types of data elements, each type having one or more data elements, comprising:
   an operation means;
   the operation means, dependent upon the time said means is operated, causing the selection of a value of a data element;
   display means;
   first register means adapted for registering and delivering to said display means, selectable values of data elements of the said different types of data elements;
   second register means for registering and delivering to said first register means and to said display means indication information controlling which one of the data elements out of the group of data elements is subject to value selection by said operation means, and predetermined indication information for data elements of the different types of data elements the values of which are to be selected subsequently;
   third register means to alter said indication information on a repeated operation of the operation means so that subsequent data elements out of the group of data elements are prepared for value selection;
   muliplexing means for allowing selection of values of data elements of a second type usable in connection with the data elements of first type;
   by which multiplexing means, for each selected value of a data element of said first type, said first and second register means being repeatedly used on the subsequent repeated operation of said operation means for selecting said values of data elements of the second type;
   fourth means connected to the first register means for detecting whether values of data elements of at least one type of data elements have been selected;

if not, said fourth means placing the indication information at and controlling the alteration thereof from a first side of the second register means, incrementing from the most significant data element of said type;

if yes, said fourth means preparing to place and on a command from a further operation means placing the indication information at and, on continued operation of said further operation means, controlling the alteration thereof from the other side of the second register means, decrementing from the least significant data element, erasing subsequent values of earlier selected data elements from the first register and the display means and after which command the erased values of the data elements being reselectable.

2. Device according to claim 1 further comprising: an extension of said second register means with one additional section adapted for receiving indication information after first having obtained a value of a data element or a complete set of values of a plurality of data elements in said first register means and displayed on the corresponding display means, said indication information in said one additional section serving as a command signal for controlling said value or complete set of values to be transferred to a device using said data element values.

3. Device for selecting values of data elements forming part of a group of data elements, said group of data elements having at least two different types of data elements, each type comprising one or more data elements including an operation means, display means and first register function means for registering and delivering values of data elements to said display means; the operation means, dependent upon the time said means is operated, causing the selection of a value of a data element through the registering and displaying of subsequent values of said data element, comprising:

a programmable digital signal processor emulating said first register function means and further emulating second register function means for registering and delivering to said first register means and to said display means indication information controlling which one of the data elements out of the group of data elements is subject to value selection;

third function means to alter said indication information on repeated operation of the operation means so that subsequent data elements out of the group of data elements are prepared for value selection;

the emulated first register function means being adapted for registering and delivering to said display means, selectable values of data elements of said different types of data elements;

wherein the emulated second register function means in said programmable digital signal processor means being adapted for registering and delivering to said first register function means and to said display means predetermined indication information for data elements of the different types of data elements the values which are to be selected subsequently;

the programmable digital signal processor further emulating multiplexing function means for selecting values of data elements of a second type usable in connection with the data elements of first type;

by which multiplexing function means for each selected value of a data element of said first type, said first and second register means being repeatedly used on the subsequent repeated operation of said operation means for selecting said values of data elements of the second type;

the programmable digital signal processor emulating fourth function means for detecting whether values of data element of at least one type of data elements have been selected;

if not, said fourth function means placing the indication information at and controlling the alteration thereof from one side of the second register function means, incrementing from the most significant data element of said type;

if yes, said fourth function means preparing to place and on a command from a further operation means placing the indication information at and, on continued operation of said further operation means controlling the alteration thereof from, the other side of the second register function means, decrementing from the least significant data element, erasing subsequent values of earlier selected data elements from the first register function means and the display means and after which command the erased values of the data elements being reselectable.

4. Device according to claim 3, wherein said emulated second register function means in said programmable digital signal processor further including means to emulate one additional section adapted for receiving indication information after first having obtained a value of a data element or a complete set of values of a plurality of data elements, said indication information in said emulated additional section serving as a command signal controlling the transfer of said value or complete set of values to a device using said data element values.

* * * * *